(12) United States Patent
Kim et al.

(10) Patent No.: US 7,482,877 B2
(45) Date of Patent: Jan. 27, 2009

(54) POWER PROTECTING APPARATUS AND METHOD FOR POWER AMPLIFIER

(75) Inventors: Kun-Wook Kim, Seoul (KR); Kyoo-Chul Choi, Seoul (KR)

(73) Assignee: LG Electronics Inc.

( * ) Notice: Subject to any disclaimer, the term of this patent is extended or adjusted under 35 U.S.C. 154(b) by 128 days.

(21) Appl. No.: 11/389,422

(22) Filed: Mar. 23, 2006

(65) Prior Publication Data
US 2006/0214734 A1 Sep. 28, 2006

(30) Foreign Application Priority Data
Mar. 23, 2005 (KR) .................. 10-2005-0024290

(51) Int. Cl.
H03F 3/10 (2006.01)
H03F 1/52 (2006.01)
(52) U.S. Cl. .................... 330/298; 330/207 P
(58) Field of Classification Search .............. None
See application file for complete search history.

(56) References Cited

U.S. PATENT DOCUMENTS

| | | | | |
|---|---|---|---|---|
| 3,668,545 A | * | 6/1972 | Von Recklinghausen .... | 330/298 |
| 3,701,031 A | * | 10/1972 | Frederiksen et al. ........ | 330/289 |
| 3,904,979 A | * | 9/1975 | Suzuki ........................ | 330/298 |
| 4,032,982 A | * | 6/1977 | Arter et al. .................. | 360/74.1 |
| 4,091,434 A | * | 5/1978 | Suzuki et al. ................ | 361/100 |
| 4,099,139 A | * | 7/1978 | Oguri .......................... | 330/298 |
| 4,178,619 A | * | 12/1979 | Seiler et al. ................. | 361/91.6 |
| 5,258,715 A | * | 11/1993 | Moll ............................ | 330/51 |
| 5,818,301 A | * | 10/1998 | Higashiyama et al. ....... | 330/266 |
| 5,905,617 A | * | 5/1999 | Kawasoe ...................... | 361/86 |
| 6,043,712 A | * | 3/2000 | Leizerovich et al. ......... | 330/279 |
| 6,097,254 A | * | 8/2000 | Yamamoto ................... | 330/298 |
| 6,160,455 A | * | 12/2000 | French et al. ................ | 330/297 |
| 6,397,090 B1 | * | 5/2002 | Cho ............................. | 455/574 |
| 6,720,831 B2 | * | 4/2004 | Dening et al. ................ | 330/298 |
| 6,900,698 B2 | * | 5/2005 | Ikeda ........................... | 330/298 |
| 7,205,843 B2 | * | 4/2007 | Nagata ......................... | 330/298 |
| 2003/0218507 A1 | * | 11/2003 | Inoue et al. .................. | 330/298 |

\* cited by examiner

*Primary Examiner*—Robert Pascal
*Assistant Examiner*—Krista Flanagan
(74) *Attorney, Agent, or Firm*—Lee, Hong, Degerman, Kang & Waimey

(57) ABSTRACT

A power protecting apparatus and method of a power amplifier for removing backward voltages and preventing a hard damage within a circuit by connecting an output terminal of a DC-DC converter with an input terminal of a filter using diodes when an excessive backward voltage is generated due to physical characteristics of an inductor within the circuit at the time of applying high power level and low power level to the power amplifier using switching devices within a power circuit in order to optimize power consumption.

21 Claims, 2 Drawing Sheets

POWER PROTECTING APPARATUS AND METHOD FOR POWER AMPLIFIER

CROSS REFERENCE TO RELATED APPLICATIONS

Pursuant to 35 U.S.C. § 119(a), this application claims the benefit of earlier filing date and right of priority to Korean Patent Application No. 10-2005-0024290, filed on Mar. 23, 2005, the content of which is hereby incorporated by reference herein in its entirety.

BACKGROUND OF THE INVENTION

1. Field of the Invention

The present invention relates to a power amplifier of a mobile communications terminal, and particularly, to a power protecting apparatus and method of a power amplifier.

2. Background of the Related Art

The so-called near-far problem, which related to a reception sensitivity between a mobile communications terminal and a base station, refers to a backward power control procedure and causes a path loss according to the distance between the mobile communications terminal and the base station.

For example, a low transmission power level of the base station increases a bit error rate, while a high transmission power level thereof causes an interface between the mobile communications terminal and the base station, resulting in degraded service quality. The base station must provide services with the same quality to every mobile communications terminal by receiving radio communication signals from the mobile communications terminals using the same power level. Accordingly, the base station uses a Pulse Density Modulation (PDM) signal to control the transmission power of each mobile communications terminal.

In order to control the transmission power, the mobile communications terminals use a gain adjustment method, namely, a two-stage power amplifying method in which the transmission power of the mobile communications terminal can be controlled based upon a high gain mode and a low gain mode. Here, in order to optimize current consumption, a battery power of the high gain mode or a DC/DC converter power of the low gain mode is selected to be used as an operation power of a power amplifier within the mobile communications terminal. The mobile communications terminal can control its transmission power by using the selected power as the operation power of the power amplifier therein.

However, the two-stage power amplifying method repeatedly switches a high level transmission power and a low level transmission power in a high speed manner in order to support the mobility of the mobile communications terminal. Accordingly, it is possible to allow an increase or a decrease of the levels of the transmission power. However, the repeated switching operation at high speed momentarily cuts off the forward voltage that forms across an inductor, and thereby generates an excessive backward voltage. As a result, undesirable hard damage occurring within and impairing the power circuit causes many problems.

SUMMARY OF THE INVENTION

Therefore, an object of the present invention is to provide a power protecting apparatus for filtering a backward voltage which is generated when frequently changing a high gain mode and a low gain mode of a power amplifier.

To achieve these and other advantages and in accordance with the purpose of the present invention, as embodied and broadly described herein, there is provided a mobile communications terminal comprising: a power amplifier for performing two stages, namely, a low gain mode and high gain mode, of linear amplification for power levels of first power and second power having been received; a controller for controlling the gain modes of the power amplifier according to a received PDM signal; and a power protecting apparatus for removing a backward voltage which is generated when consecutively changing the high gain mode into the low gain mode or the low gain mode into the high gain mode.

Preferably, the power protecting apparatus may comprise: a fist power terminal for supplying the first power which is equal to or more than a particular voltage; a second power terminal for supplying the second power which is less than a particular voltage; a first Field Effect Transistor (FET) for maintaining a turn-on state to allow the first power to be transferred to the power amplifier while the power amplifier is in the high gain mode; a converter for supplying the second power to the power amplifier while the power amplifier is in the low gain mode; a filter for filtering noise element contained in an output of the converter; and a power protecting unit for filtering a backward voltage generated when supplying the second power to the power amplifier.

Preferably, the power protecting unit may include: a first diode for removing a plus backward voltage generated between the filter and an output terminal of the converter; and a second diode for removing a minus backward voltage generated between the filter and the output terminal of the converter.

Preferably, the first diode bypasses the plus backward voltage toward the second power terminal when the plus backward voltage is greater than a maximum reference value.

Preferably, the first diode is used to connect an anode to the output terminal of the converter, and to connect a cathode to the second power terminal.

Preferably, the second diode is used to connect an anode to the output terminal of the converter, and to connect a cathode to a ground of the converter.

Preferably, the second diode bypasses the minus backward voltage toward the ground of the converter when the minus backward voltage is smaller than a minimum reference value.

The foregoing and other objects, features, aspects and advantages of the present invention will become more apparent from the following detailed description of the present invention when taken in conjunction with the accompanying drawings.

DETAILED DESCRIPTION OF THE INVENTION

One aspect of the present invention involves the recognition by the present inventors of the drawbacks in the related art, as explained above. Based upon such recognition, improvements to a power protecting apparatus for a power amplifier of a mobile communication terminal can be achieved according to the present invention.

The present invention purposes a scheme for removing and absorbing undesirable backward voltage by connecting an output terminal of a DC/DC converter with a filter of a power circuit of a power amplifier using diodes.

Hereinafter, an exemplary embodiment of the present invention will be explained with reference to the attached drawing.

Figure 1:
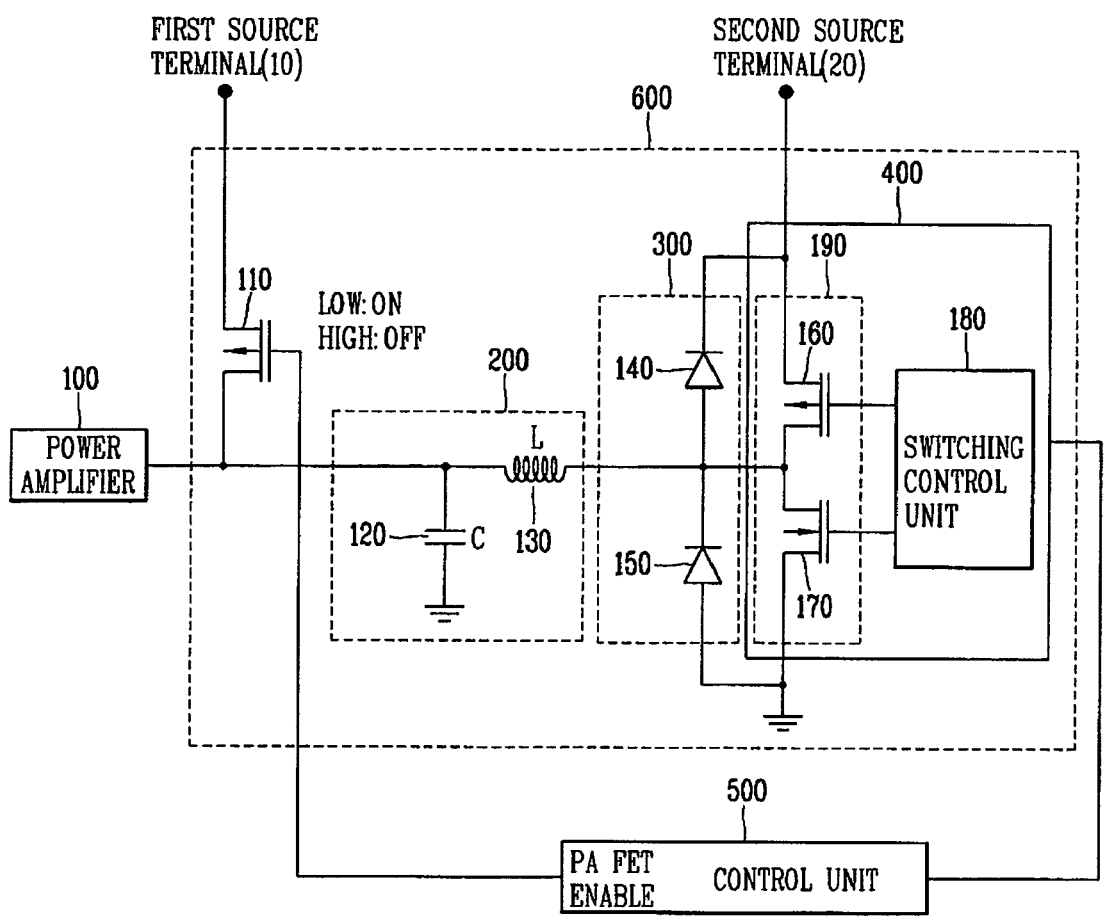
FIG. 1 is a schematic diagram illustrating an exemplary power protecting apparatus for a power amplifier of a mobile communications terminal according to the present invention.

FIG. 1 is a schematic diagram illustrating an exemplary power protecting apparatus for a power amplifier of a mobile communications terminal according to the present invention.

As illustrated in FIG. 1, a mobile communications terminal according to the present invention may include a power amplifier 100 for linearly amplifying power levels of a first power source and a second power source applied thereto by performing two stages (namely, a low gain mode and a high gain mode), a controller 500 for controlling the gain modes of the power amplifier 100 according to a received PDM signal, and a power protecting apparatus 600 for removing a backward voltage generated when consecutively (repeatedly) changing the low gain mode into the high gain mode or the high gain mode into the low gain mode.

The controller 500 controls an on/off state of a first FET 110 according to the PDM signal received from a base station, and also controls an on/off state of a switching unit 190 by a switching control unit 180.

The power protecting apparatus 600 may include a first power source terminal 10 for supplying a first power source which is equal to or more than a particular voltage, a second power source terminal 20 for supplying a second power source which is less than a particular voltage, the first FET 110 for maintaining an on-state of the power amplifier 100 to thus allow the first power to be transferred to the power amplifier 100 during the high gain mode of the power amplifier 100, a converter 400 for supplying the second power to the power amplifier 100 during the low gain mode of the power amplifier 100, a filter 200 placed between an output terminal of the converter 400 and an input terminal of the power amplifier 100 for charging/discharging the second power and for removing noise element contained in an output of the converter 400, and a power protecting unit 300 for removing a backward voltage generated when supplying the second power to the power amplifier 100.

When the power amplifier 100 is in the high gain mode, the first FET 110 is controlled to be in the on-state. Accordingly, a battery power of the mobile communications terminal, namely, a high level voltage (e.g., 3.7V) of the first power source terminal 10 is supplied to the power amplifier 100.

On the other hand, when the power amplifier 100 is in the low gain mode, the first FET 110 is controlled to be in the off-state. Accordingly, the high level voltage (e.g., 3.7V) of the first power source terminal 10 is not applied to the power amplifier 100. Instead, the switching unit 190 is controlled to be in the on-state and thereby a low level voltage (e.g., 1.5V) of the second power source terminal 20 is supplied to the power amplifier 100.

The first FET 110 is a P-type FET with its source connected to the first power source terminal 10 and its drain connected to the power amplifier 100. When the first FET 110 is in the on-state, the power of the first power source terminal 10 is transferred to the power amplifier 100. The first FET 110 has its gate connected to the controller 500 of the mobile communications terminal to thus be turned on/off under the control of the controller 500 of the mobile communications terminal.

The converter 400 indicates a Direct Current-Direct Current (DC-DC) converter, which includes the switching unit 190 and the switching control unit 180.

The switching unit 190 is composed of a second FET 160 and a third FET 170 which are complementarily operated.

The second FET 160 is also the P-type FET with its source connected to the second power terminal 20 and its drain connected to the third FET 170. The third FET 170 is an N-type FET with its drain connected to the second FET 160 and its source connected to the ground.

The switching control unit 180 applies a control signal with a high level and a control signal with a low level, respectively, to gate terminals of the second FET 160 and the third FET 170 under the control of the controller 500, to thus control an on/off state of the switching unit 190.

The power protecting unit 300 can be composed of two rectifier devices, namely, a first diode 140 and a second diode 150. The first diode 140 has its anode connected to the output terminal of the DC-DC converter 400 and its cathode connected to the second power terminal 20. Accordingly, when a positive backward voltage exceeds a maximum reference value (e.g., a second Vcc+0.7V), the first diode 140 bypasses the positive backward voltage toward the second power terminal 20.

The second diode 150 has its anode connected to the output terminal of the DC-DC converter 400 and its cathode connected to ground. Accordingly, when a negative backward voltage is less than a minimum reference value (e.g., −0.7V), the second diode 150 bypasses the negative backward voltage to ground.

The filter 200 can include an inductor 130 and a condenser 120. The inductor 130 is positioned between the output terminal of the DC-DC converter 400 and the input terminal of the condenser 120 to charge and/or discharge an output power of the DC-DC converter 400. The condenser 120 is positioned between an output terminal of the inductor 130 and the input terminal of the power amplifier 100 to filter noise elements contained in an output signal of the inductor 130.

Figure 2:
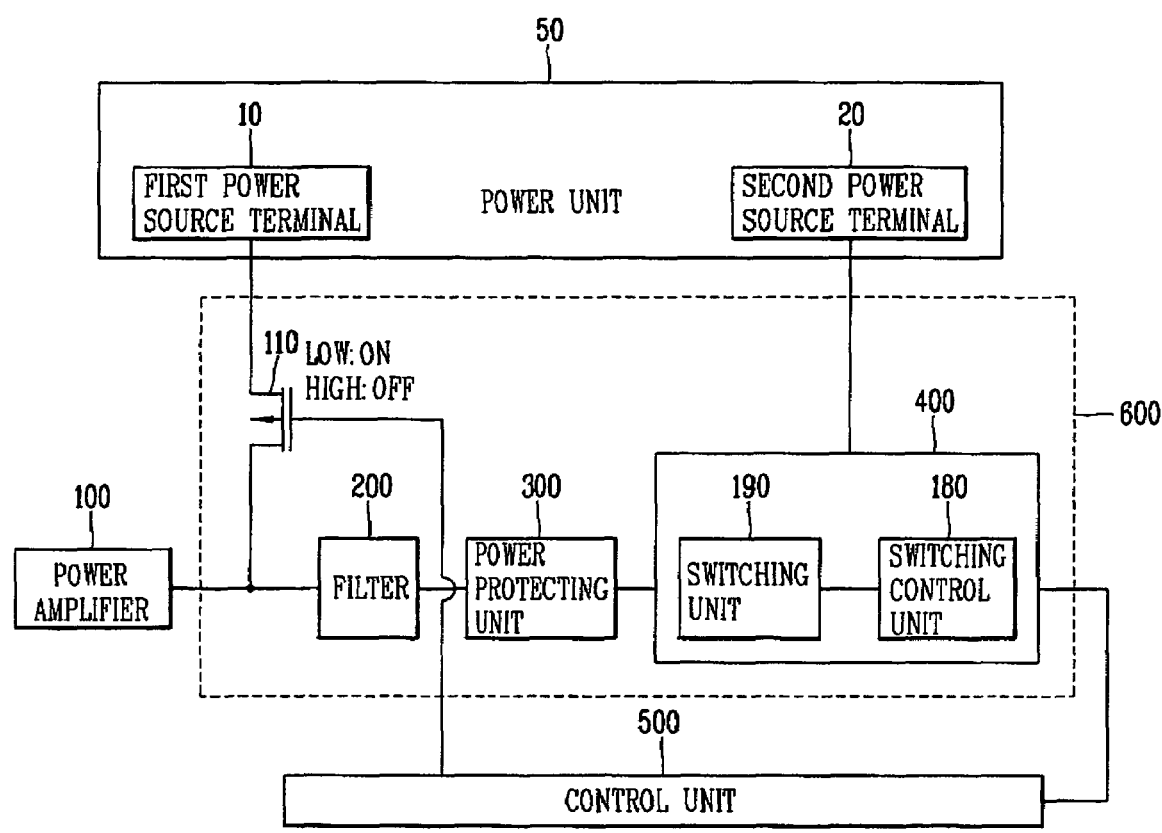
FIG. 2 is a block diagram illustrating an exemplary power protecting apparatus for a power amplifier of a mobile communications terminal based on the FIG. 1.

Referring to FIGS. 1 and 2, a power protecting method of a power amplifier in accordance with an exemplary embodiment of the present invention will now be explained in more detail.

It is assumed that the first power source terminal 10 outputs a high level voltage of 3.7V and the second power source terminal 20 outputs a low level voltage of 1.5V.

In FIG. 2, the first source terminal 10 and the second source terminal 20 is referred to as the power unit 50.

When a transmission power of the mobile communications terminal is lower than a reference power level, a base station sends a PDM signal for requiring an increase in the transmission power to the mobile communications terminal. Upon receiving the PDM signal, the controller 500 of the mobile communications terminal applies a low level voltage to the gate of the first FET 110 to turn it on.

Accordingly, the power of the first power source terminal 10 (i.e., 3.7V) is applied to a source of the first FET 110 to thus be supplied to the power amplifier 100 via its drain. The power amplifier 100 accordingly sends power with a high gain mode level.

The switching control unit 180, on the other hand, controls the second FET 160 and the third FET 170 under the control of the controller 500 to block the applying of power with the second Vcc (i.e., 1.5V) to the power amplifier 100 while the first FET 110 maintains its on-state.

Upon receiving a PDM signal for requiring a decrease in the transmission power of the mobile communications terminal, the controller 500 applies a high level voltage to the gate of the first FET 110 to turn it off.

When the first FET 110 is turned off, the voltage of 3.7V of the first power source terminal 10 is not applied to the power amplifier 100 as an operation voltage thereof.

The switching control unit 180 controls the second FET 160 and the third FET 170 under the control of the controller 500 to allow an output of the low level voltage of about 1.5V from the DC-DC converter 400.

Afterwards, the voltage of 1.5V outputted from the DC-DC converter 400 is charged and/or discharged by the inductor 130, and a ripple effect thereof is filtered by the condenser 120. Then, a voltage of 1.5V is supplied to the power amplifier 100. The power amplifier 100 having received the signal from the DC-DC converter 400 sends power with a low gain mode level.

If deterioration of a communication environment between the mobile communication terminal and the base station continues to be poor, the mobile communications terminal repeatedly performs the level-up and level-down operations of the transmission power thereof, and the power amplifier 100 repeatedly performs the change of the gain mode (i.e., high gain mode ⇆ low gain mode). At the time when the gain mode of the power amplifier 100 is changed, an excessive backward voltage is generated between the output terminal of the DC-DC converter 400 and the input terminal of the filter 200 due to the physical characteristics of the inductor 130, which is connected to the output terminal of the DC-DC converter 400.

If the generated backward voltage is a positive (+) backward voltage and exceeds the maximum reference value (i.e., the second power +0.7V), the first diode 140 bypasses the positive backward voltage toward the second power terminal 20, thereby providing protection of the second FET 160 and the third FET 170 from the positive backward voltage.

Conversely, if the generated backward voltage is a negative (−) backward voltage and is less than the minimum reference value (i.e., 0.7V), the second diode 150 bypasses the negative backward voltage toward the ground, thereby providing protection of the second FET 160 and the third FET 170 from the minus backward voltage.

The apparatus and method for protecting power of the power amplifier is not limited on the aforementioned embodiment, but may be variously modified and used within the scope accepted by the technical scope of the present invention.

As described above, in the present invention, diodes are used to filter the backward voltages of the power amplifier by hardware, and thus the power can be supplied in a more stable manner to the power amplifier and the power of the power amplifier can thus be protected.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. A power protecting apparatus comprising:
   a power amplifier for performing two stages of linear amplification by receiving a first power and the second power;
   a switch for maintaining an on-state of the power amplifier to allow the first power to be transferred to the power amplifier while the power amplifier performs the first stage of the linear amplification;
   a converter for supplying the second power to the power amplifier while the power amplifier performs the second stage of the linear amplification; and
   a power protecting unit for removing a backward voltage generated when the second power is supplied to the power amplifier.

2. The apparatus of claim 1, wherein the power protecting unit includes:
   a first power source terminal for supplying a first power which is equal to or more than a particular voltage;
   a second power source terminal for supplying a second power which is less than a particular voltage.

3. The apparatus of claim 1, wherein the converter is a Direct Current-Direct Current (DC-DC) converter.

4. The apparatus of claim 1, wherein the converter includes:
   a switching unit equipped with two Field Effect Transistors (FETs) which are complementarily operated; and
   a switching control unit for controlling an on/off state of the switching unit.

5. The apparatus of claim 1, wherein the switch is a first FET with its source connected to the first power terminal and its drain connected to the power amplifier.

6. The apparatus of claim 3, wherein the switching unit includes:
   a second FET with its source connected to the second power source terminal; and
   a third FET with its drain connected to the drain of the second FET, and its source connected to a ground.

7. The apparatus of claim 5, wherein the switching control unit applies on and off signals to gate terminals of the second and third FETs.

8. The apparatus of claim 1, further comprising:
   a filter connected to an output terminal of the converter for filtering noise contained in an output signal of the converter.

9. The apparatus of claim 7, wherein the filter includes:
   an inductor for charging and discharging an output power of the converter; and
   a condenser for filtering noise of the power outputted from the inductor.

10. The apparatus of claim 7, wherein the power protecting unit includes:
    a first diode for removing a positive backward voltage generated between the filter and the output terminal of the converter; and
    a second diode for removing a negative backward voltage generated between the filter and the output terminal of the converter.

11. The apparatus of claim 10, wherein the first diode with its anode connected to the output terminal of the converter and its cathode connected to the second power source terminal.

12. The apparatus of claim 10, wherein the first diode bypasses the positive backward voltage toward the second power source terminal when the positive backward voltage is greater than a maximum reference value.

13. The apparatus of claim 10, wherein the second diode has its anode connected to the output terminal of the converter and its cathode connected to the ground of the converter.

14. The apparatus of claim 10, wherein the second diode bypasses the negative backward voltage toward the ground of the converter when the negative backward voltage is smaller than a minimum reference value.

15. A mobile communications terminal comprising:
    a power amplifier for performing an amplification for power levels by receiving a first power and a second power;

a controller for controlling the gain of the power amplifier according to a received control signal;

a power protecting apparatus for removing backward voltages generated when changing the gain.

16. The terminal of claim 15, wherein the power protecting apparatus comprises:

a first power source terminal for supplying a first power which is equal to or more than a particular voltage;

a second power source terminal for supplying a second power which is less than a particular voltage;

a switch for maintaining an on-state of the power amplifier to allow the first power to be transferred to the power amplifier during the high gain mode of the power amplifier;

a converter for supplying the second power to the power amplifier during the low gain mode of the power amplifier;

a filter for filtering noise element contained in an output of the converter; and a power protecting unit for removing backward voltages generated when the second power is supplied to the power amplifier.

17. The terminal of claim 16, wherein the power protecting unit includes:

a first diode for removing a positive backward voltage generated between the filter and the output terminal of the converter; and a second diode for removing a negative backward voltage generated between the filter and the output terminal of the converter.

18. The terminal of claim 17, wherein the first diode bypasses the positive backward voltage toward the second power source terminal when the positive backward voltage is greater than a maximum reference value.

19. The terminal of claim 17, wherein the first diode has its anode connected to an output terminal of the converter and its cathode connected to the second power source terminal.

20. The terminal of claim 17, wherein the second diode has its anode connected to the output terminal of the converter and its cathode connected to a ground of the converter.

21. The terminal of claim 17, wherein the second diode bypasses the negative backward voltage toward a ground of the converter when the negative backward voltage is smaller than a minimum reference value.

* * * * *